(12) United States Patent
Fast et al.

(10) Patent No.: US 7,248,664 B2
(45) Date of Patent: Jul. 24, 2007

(54) TIMESLICED DISCRETE-TIME PHASE LOCKED LOOP

(75) Inventors: Douglas Fast, Warman (CA); Surinder Kumar, Victoria (CA); Sumit Kumar, Sooke (CA)

(73) Assignee: Vecima Networks Inc., Victoria, British Columbia (CA)

( * ) Notice: Subject to any disclaimer, the term of this patent is extended or adjusted under 35 U.S.C. 154(b) by 626 days.

(21) Appl. No.: 10/671,872

(22) Filed: Sep. 29, 2003

(65) Prior Publication Data

US 2004/0131136 A1   Jul. 8, 2004

(51) Int. Cl.
*H03D 3/24*   (2006.01)
(52) U.S. Cl. .............. 375/376; 375/371; 375/373; 329/307; 327/147; 327/156; 332/127; 332/128; 702/72
(58) Field of Classification Search ........ 375/371–376; 329/307–309; 702/72; 332/127–128; 327/147–150, 327/156–158
See application file for complete search history.

(56) References Cited

U.S. PATENT DOCUMENTS 4,703,520 A * 10/1987 Rozanski et al. ............. 455/75

5,933,058 A * 8/1999 Pinto et al. .................... 331/17
2001/0015678 A1 * 8/2001 Wesolowski ................. 331/14

FOREIGN PATENT DOCUMENTS

JP   11220389 A * 8/1999

\* cited by examiner

*Primary Examiner*—Jay K. Patel
*Assistant Examiner*—Curtis B. Odom
(74) *Attorney, Agent, or Firm*—Adrian D. Battison; Michael R. Williams; Ryan W. Dupuis

(57) ABSTRACT

A time-sliced discrete-time Phase Locked Loop which is suitable for simultaneously synchronizing multiple input signals to multiple output signals is provided by implementing a discrete-time phase detector, loop filter, and voltage controlled oscillator that together operate as a single discrete-time PLL in hardware and applying control logic to retrieve the history for each signal pair from a context memory (RAM), to enable the discrete-time PLL hardware, and to store the resulting history in the context memory for use in subsequent operations for a particular input/output signal pair.

3 Claims, 3 Drawing Sheets

TIMESLICED DISCRETE-TIME PHASE LOCKED LOOP

The present invention relates to a discrete-time PLL (phase locked loop) circuit, and more particularly, to a method for utilizing a single discrete-time PLL to synchronize multiple outputs to multiple inputs.

BACKGROUND OF THE INVENTION

In a continuous-time world, establishing a common time base at physically separated locations presents some serious challenges. Typical systems use independent time bases, frequently derived from crystal oscillators. Although crystal oscillators provide extremely accurate timing references at low cost, "extremely accurate" is not adequate to maintain the integrity of discrete-time data. Timing references often have to be identical, at least in the sense of long term averages. In other words, systems must be synchronized. Underlying most synchronization techniques is the phase-locked loop (PLL).

The discrete-time PLL, described in relation to the prior art Figures hereinafter, can be used to synchronize an output signal to an input signal. If there is more than one set of input/output signals to be synchronized, then two discrete time PLLs are necessary. The number of resources or discrete-time PLLs required for implementation scales linearly with the number of input/output pairs of signals.

Typically, discrete-time PLLs are implemented in digital signal processing (DSP) chips, application specific integrated circuits (ASICs), and/or field programmable gate arrays (FPGAs). All such hardware, while experiencing continuous growth in both speed and available on-chip resources, faces limitations in the number of basic building blocks available for discrete-time PLL use including registers (memory), multipliers, accumulators, and adders/subtractors. In real time systems where numerous signals are to be synchronized, resources are quickly diminished as new hardware is allocated to provide a discrete-time PLL to each signal path. It is thus significantly advantageous to develop a means to share on-chip hardware resources across multiple input/output signal pairs.

SUMMARY OF THE INVENTION

It is one object of the invention to provide a method of substantially reducing the number of discrete-time PLLs required to synchronize multiple input/output signal pairs. The apparatus should be of low complexity so that it is easily implemented in readily available hardware.

According to the present invention there is provided a method of simultaneously synchronizing multiple input signals to multiple output signals, comprising:

communicating a plurality of signal pairs each comprising a clock input and a signal input;

providing a discrete-time phase detector, loop filter, and voltage controlled oscillator that together operate as a single discrete-time phase locked loop in hardware for calculating an output signal from an input signal;

providing a control logic;

providing a context memory (RAM) for storing a history for each of the respective signal pairs;

and, upon receipt at the discrete-time phase detector of the clock signal of a respective one of the signal pairs, operating the control logic:

to retrieve from the context memory the history for the respective signal pair, to enable the discrete-time phase locked loop to calculate from the respective input signal a respective output signal thus defining a resulting history for the respective input signal, and to store the resulting history in the context memory for use in subsequent calculations for the respective input signal pair.

Preferably the Context memory is arranged to store and retrieve a history from the loop filter and a history from the Voltage Controlled Oscillator of the discrete-time phase locked loop.

Preferably there is provided a high speed clock signal which is supplied to the control logic to control routing of input signals to the discrete-time Phase Locked Loop, retrieving of the history from the Context memory RAM, writing of the history into the loop filter and Voltage Controlled Oscillator registers of the discrete-time PLL, triggering of the discrete-time Phase Locked Loop stages, storing of the history from the loop filter and Voltage Controlled Oscillator registers into the Context RAM, and routing of the output signal to a respective output port. The rate of the high speed clock must be greater then or equal to the combined rates of the input sample clocks such that sufficient bandwidth is made available in order to process each input signal independently. That is to say that the speed of calculation of the discrete-time PLL must be sufficiently fast that it may accommodate all calculation requests from the input signals.

The present invention thus provides a time-sliced discrete-time PLL apparatus which is suitable for simultaneously synchronizing multiple input signals to multiple output signals comprising:

implementing a discrete-time phase detector, loop filter, and voltage controlled oscillator that together operate as a single discrete-time PLL in hardware;

and applying control logic to retrieve the history for each signal pair from a context memory (RAM), enable the discrete-time PLL hardware, and store the resulting history in the context memory for use in subsequent operations for a particular input/output signal pair.

Due to the fact that a discrete-time PLL simply consists of stored data, operations on that data in combination with the new input sample, and storage of the results as history for subsequent samples, a single, shared PLL with memory for each individual signal path can operate identically to allocating a unique discrete-time PLL to each signal path. Hence, the hardware required to synchronize multiple signals is minimized. Using a single DPLL with context memory in a time-sliced manner provides dramatic saving of resources in a scenario where many signals must be synchronized.

One particularly relevant example is an MPEG-2 digital video multiplexer wherein multiple digital video bit streams (typically 10 or more) are packetized and multiplexed to form a single aggregate transport stream where each program carries an independent clock domain requiring synchronization. Clock information is communicated through samples of a ramp function (described as the Program Clock Reference or PCR) for each program, the slope of which provides the clock frequency. Due to the packetized nature of the transport stream, a shared, time-sliced DPLL, which calculates in less than 1 packet time, can be applied to synchronize each ramp independently as prescribed in the present invention. Packet header information can be used to uniquely identify each program and thereby provide the necessary addressing to store and retrieve the PLL history as required.

Several objects and advantages which may be provided by the method as described herein are:

1. To provide a DPLL which can be used to track multiple independent input signals simultaneously, 2. To provide a DPLL which has low complexity and is able to operate in real time, 3. To provide a DPLL which incorporates a minimum of analog components in order to minimize the cost of the implementation.

These and other advantages of the present invention will become apparent to those skilled in the art upon a reading of the following descriptions of the invention and a study of the several figures of the drawing.

BRIEF DESCRIPTION OF THE DRAWING FIGURES

DETAILED DESCRIPTION

Figure 1:
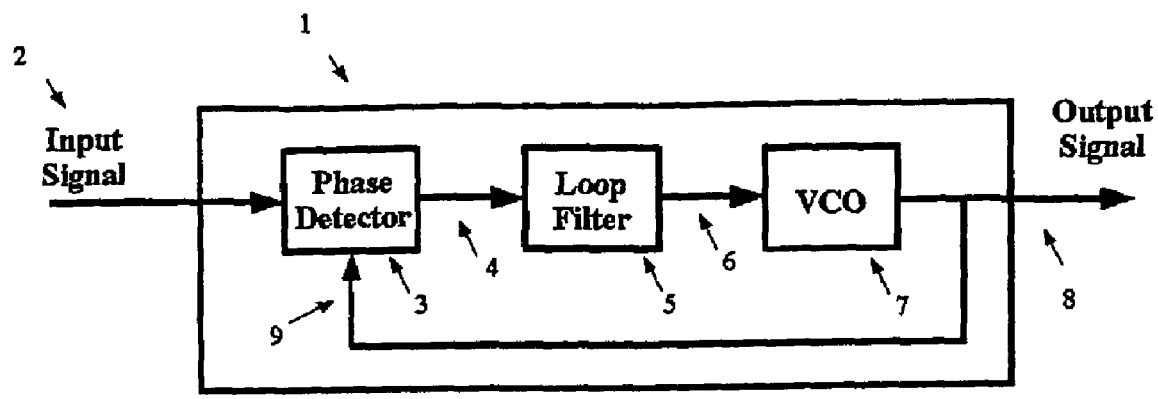
FIG. 1 is a schematic block diagram of a prior art basic PLL.
Figure 2:
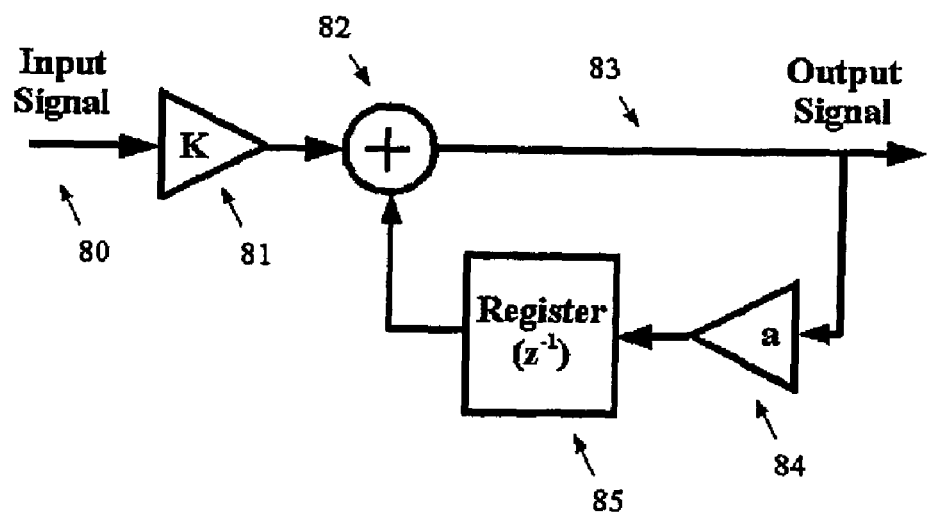
FIG. 2 is a schematic block diagram of a prior art discrete-time loop filter.
Figure 3:
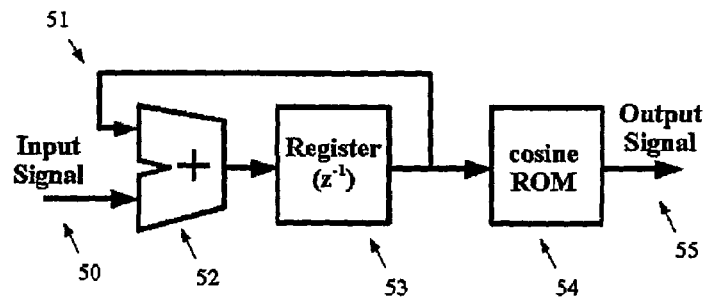
FIG. 3 is a schematic block diagram of a prior art discrete-time VCO.

The basic prior art Phase Locked Loop (PLL) structure 1 is shown in FIGS. 1, 2 and 3. The voltage-controlled oscillator (VCO) 7 attempts to produce a signal 8 that tracks the phase of an input 2. A phase detector 3 measures the phase error between the input 2 and the VCO output 8, 9. The resulting error signal 4 can be filtered by the loop filter 5 to become a control signal 6 that drives the VCO 7. The basic idea is well known: if the VCO phase gets ahead of the phase of the input, the control signal should be reduced. If the VCO phase gets behind, the control signal should be increased. As with any feedback system, the parameters must be chosen to ensure stability.

A discrete-time PLL is one that is implemented using discrete-time logic and circuits. The basic discrete-time PLL architecture is virtually identical to the one shown in FIG. 1, however the input is a sequence of samples, and the internal components are operated in a discrete fashion at a clock rate that is synchronized to the input sample clock.

The discrete-time phase detector can take many forms. One implementation uses a simple subtraction where the feedback signal is subtracted from the input signal to produce the error signal. There is no history stored in the phase detector.

The discrete time loop filter for use in FIG. 1 is shown in FIG. 2. This is a first order implementation of the equation $K/(1-az^{-1})$. The input signal 80 is multiplied by a gain constant K in a multiplier 81. The resulting signal is then summed in a summer 82 with the output of a feedback path register 85. The output 83 of the summer 82 is the output of the filter. The output signal is then fed back through a block 84 where it is scaled by a constant "a". The scaled value is then stored in the register 85. The output of this register is then used in the summer 82 as was already described.

The discrete-time VCO for use in FIG. 1 is shown in FIG. 3. It is, in essence, a phase accumulator followed by a cosine lookup table. The input signal 50 is summed with the previous output 51 in the summer 52. The output of the summer is stored in the register 53. The output of the register is then used to address a cosine lookup table 54. The cosine lookup table is optional. If the discrete-time PLL input signal is a ramp, then the output of the VCO will simply be the output of the phase accumulator. However, if the desired output is a sinusoid, then the cosine lookup table is required.

The present invention provides a time-sliced discrete-time PLL apparatus which is suitable for simultaneously synchronizing multiple input signals to multiple output signals. Before explaining the time shared architecture in detail, it is instructive to first consider a discrete-time PLL with a single input signal and sample clock pair. The discrete-time PLL collects a history, stored in the registers in the loop filter and VCO, which is associated with that set of input signals.

In the time-shared architecture utilized in the present invention, a single discrete-time PLL is used in conjunction with a context storage RAM and control logic to implement a time-shared discrete-time PLL. The operation of the discrete-time PLL has already been described. The Context RAM is used to store the history associated with each set of input signals. The history associated with each set of input signals can be thought of as a context. The control logic is a state machine which operates according to the following algorithm:

1. Wait for new input samples
2. Select input signal
3. Determine context and load history from context RAM into loop filter and VCO.
4. Calculate new output value.
5. Store new history from loop filter and VCO into context RAM, overwriting the previous values.
6. Return to step 1.

Figure 4:
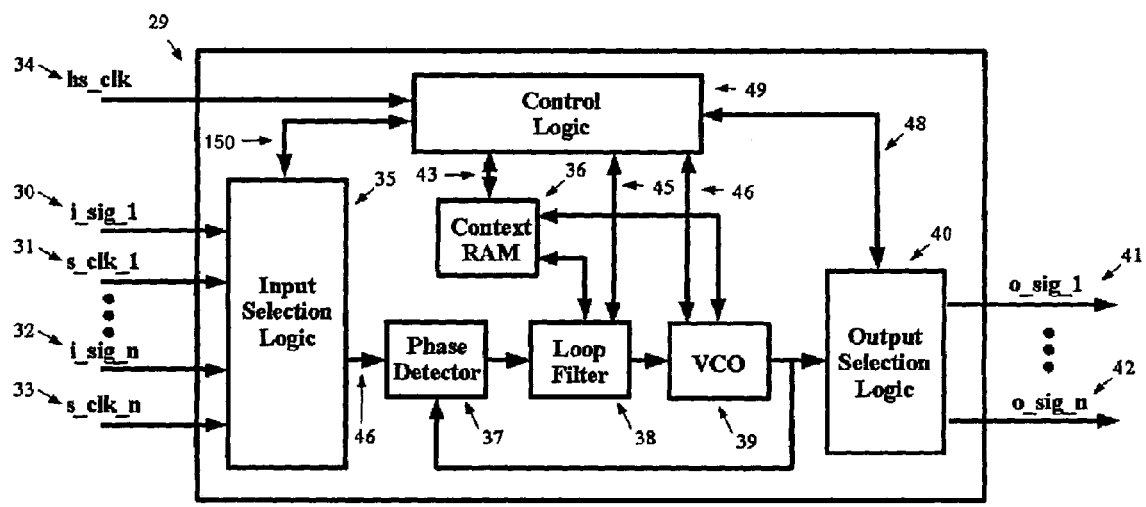
FIG. 4 is a schematic block diagram of a discrete-time PLL apparatus according to the present Invention.

The apparatus according to the present invention is shown in FIG. 4. The discrete-time PLL 29 is controlled by a Control Logic block 49. The Control Logic Block 49 monitors the input signals 30, 32 and sample clocks 31, 33 to the Input Selection Logic Block 35 through the control interface 150. As each new input sample is received by the Input Selection Logic Block 35, it is passed through to the Phase Detector Block 37 under the direction of the Control Logic Block 49. The operation of the Control Logic Block 49 and other circuitry is clocked by a high speed clock 34. The frequency of this clock must be fast enough to allow the control logic to select and service each input signal as often as requested based upon the input sample clocks 31, 33. The Control Logic Block 49 also oversees the operation of the Context RAM 36 to store the history register contents of the loop filter 38 and VCO 39 blocks. The loading and storing of the history in the Context RAM 36 is controlled by the Control Logic Block. Finally, the Control Logic instructs the Output Selection Logic to pass each output sample to the appropriate output port 41, 42.

Figure 5:
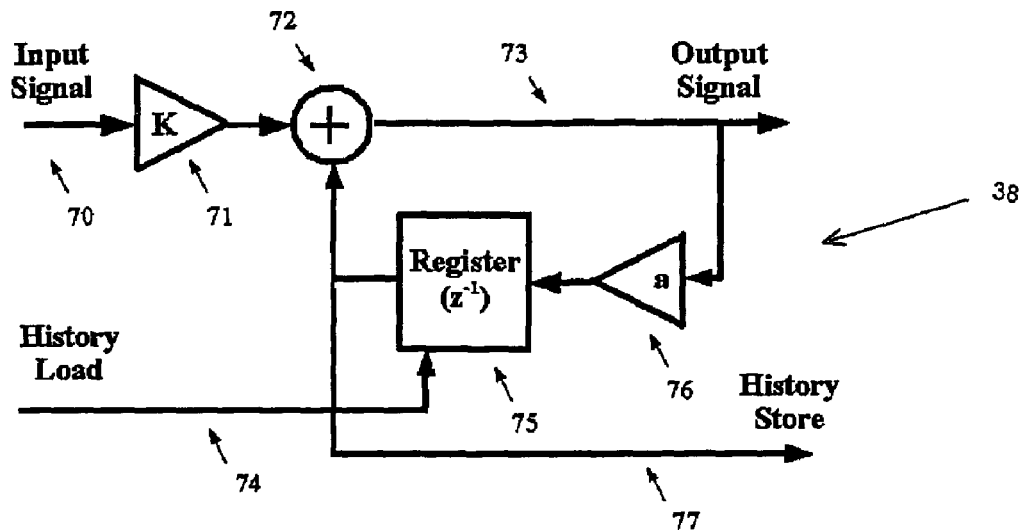
FIG. 5 is a schematic block diagram of a discrete-time loop filter according to the present Invention for use in the apparatus of FIG. 4.

The Loop Filter of FIG. 4 is shown in more detail in FIG. 5. The primary difference between this structure and that shown in FIG. 2 is the addition of a history load bus 74 which is used to load the previous history associated with a given context into the register at the beginning of the calculation, and the history store bus 77 which is used to store the new history associated with a given context back into the Context RAM 36 at the end of the calculation.

Figure 6:
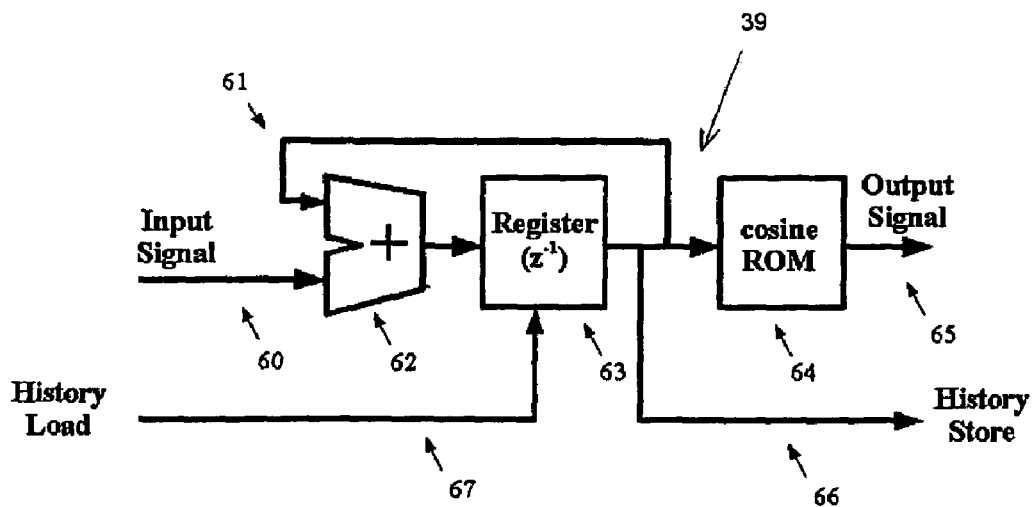
FIG. 6 is a schematic block diagram of a discrete-time VCO according to the present Invention for use in the apparatus of FIG. 4.

The VCO of FIG. 4 is shown in more detail in FIG. 6. The primary difference between this structure and that shown in FIG. 3 is the addition of a history load bus 67 which is used to load the previous history associated with a given context into the register at the beginning of the calculation, and the history store bus 66 which is used to store the new history associated with a given context back into the Context RAM 36 at the end of the calculation.

Although the invention is illustrated and described herein, it is nevertheless not intended to be limited to the details shown, since various modifications and structural changes may be made therein without departing from the spirit of the invention and within the scope and range of equivalents of the claims.

The operation of the apparatus described above and shown in FIGS. 4 to 6 can be illustrated by examining the process by which an output sample is computed for a new input sample by the time-sliced discrete-time PLL apparatus. For the sake of simplicity, the process will be described for a ramp function input wherein the input samples are simply the current value of the input ramp. A sinusoidal signal can be synchronized with the same system by simply adding a cosine lookup table 64 in the VCO 39 as described above.

When s_clk_1 31 is enabled, the Input Selection Logic 35 communicates through the control interface 150 to the Control Logic block 49 that a new sample has arrived for i_sig_1 30. The Control Logic block 49 then retrieves the history from the Context RAM 36 for input signal i_sig_1 30 over the RAM data interface 43. The Control Logic block 49 communicates with the Loop Filter 38 through the interface 45 and with the VCO 39 through the interface 46.

The Loop Filter Register 75 is then loaded through its history load bus 74 and the VCO Register 63 is loaded through its history load bus 67, with the data retrieved from context RAM 36. Those skilled in the art will recognize that the remainder of the calculation performs as a standard discrete-time PLL.

The Phase Detector 37 then subtracts the VCO register value (the register value from the last cycle just loaded from RAM) from the i_sig_1 sample 30 which has been routed to the Phase detector by the Input Selection Logic over link 46.

The Loop Filter 38 shown in FIG. 5 is then triggered to compute a new output sample 73 by multiplying the input sample 70 in the multiplier 71 by the gain K and adding in the summer 72 the result to the value from the register 75 (the register value from the last cycle just loaded from RAM). The resulting output sample 73 is then multiplied by the gain a in multiplier 76 and the result is stored in the register 75 for use next cycle.

The loop filter output signal 73 becomes the VCO input signal 60. The VCO 39 shown in FIG. 6 is then triggered to compute a new output sample 65 by adding at summer 62 the input sample 60 to the value from the register 63 (the register value from the last cycle just loaded from RAM) and to store the result in the register 63 for use next cycle. The VCO output sample 65 is then passed to the Output Selection Logic 40 which routes the sample to o_sig_1 41 as dictated by the control logic block 49 through the control interface 48.

The Control Logic block 49 then retrieves the new value from the Loop filter register 75 through its history store bus 77 and the new value from the VCO register 63 through its history store bus 66 and writes the data to the context RAM 36 over the RAM data interface 43.

The calculation cycle is then complete and the DPLL is ready to accept a new sample from any of the input signals i_sig_1 30 through i_sig_n 32. All operations in the above calculation cycle are clocked at the hs_clk 34 rate whereas the apparatus is triggered according to the input sample clocks 31, 33.

The invention claimed is:

1. A method of simultaneously synchronizing multiple input signals to multiple output signals, comprising:
    communicating a plurality of signal pairs each comprising a clock input and a signal input;
    providing a discrete-time phase detector, loop filter, and voltage controlled oscillator that together operate as a single discrete-time phase locked loop (PLL) in hardware for calculating an output signal from an input signal;
    providing a control logic;
    providing a context memory (RAM) for storing a history for each of the respective signal pairs;
    and, upon receipt at the discrete-time phase detector of the clock signal of a respective one of the signal pairs, operating the control logic
    to retrieve from the context memory the history for the respective signal pair,
    to enable the discrete-time PLL to calculate from the respective input signal a respective output signal thus defining a resulting history for the respective input signal,
    and to store the resulting history in the context memory for use in subsequent calculations for the respective input signal pair.
    wherein the PLL is arranged to carry out a calculation for each of the signal pairs;
    and wherein the multiple input signals are simultaneously synchronized by effecting the calculations of the PLL at a rate such that every input signal pair is serviced.

2. The method according to claim 1 wherein the context memory is arranged to store and retrieve a history from the loop filter and a history from the Voltage Controlled Oscillator of the discrete-time phase locked loop.

3. The method according to claim 1 wherein there is provided a high speed clock signal which is supplied to the control logic to control routing of input signals to the discrete-time PLL, retrieving of the history from the context memory RAM, writing of the history into the loop filter and voltage controlled oscillator registers of the discrete-time PLL, triggering of the discrete-time PLL stages, storing of the history from the loop filter and voltage controlled oscillator registers into the context RAM, and routing of the output signal to a respective output port.

* * * * *